(12) United States Patent
Ferrer et al.

(10) Patent No.: US 10,192,822 B2
(45) Date of Patent: Jan. 29, 2019

(54) MODIFIED TUNGSTEN SILICON

(71) Applicant: GLOBALFOUNDRIES INC., Grand Cayman (KY)

(72) Inventors: Domingo A. Ferrer, Fishkill, NY (US); Kriteshwar K. Kohli, Fishkill, NY (US); Siddarth A. Krishnan, Peekskill, NY (US); Joseph F. Shepard, Jr., Poughkeepsie, NY (US); Keith Kwong Hon Wong, Wappingers Fall, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 134 days.

(21) Appl. No.: 14/623,115

(22) Filed: Feb. 16, 2015

(65) Prior Publication Data
US 2016/0240478 A1    Aug. 18, 2016

(51) Int. Cl.
*H01L 27/112*  (2006.01)
*H01L 23/525*  (2006.01)
*H01L 23/522*  (2006.01)
*H01L 21/768*  (2006.01)

(52) U.S. Cl.
CPC ...... *H01L 23/5256* (2013.01); *H01L 23/5228* (2013.01); *H01L 27/11206* (2013.01); *H01L 21/76886* (2013.01)

(58) Field of Classification Search
None
See application file for complete search history.

(56) References Cited

U.S. PATENT DOCUMENTS

| | | | |
|---|---|---|---|
| 4,609,903 A | 9/1986 | Toyokura et al. | |
| 5,440,174 A | 8/1995 | Nishitsuji | |
| 6,025,632 A | 2/2000 | Fukuda et al. | |
| 6,329,262 B1 | 12/2001 | Fukuda et al. | |
| 6,359,339 B1 | 3/2002 | Gregor et al. | |
| 6,730,984 B1 | 5/2004 | Ballantine et al. | |
| 6,884,690 B2 | 4/2005 | Behammer | |
| 6,890,810 B2 | 5/2005 | Amadon et al. | |
| 7,314,786 B1 | 1/2008 | Yang et al. | |
| 8,530,320 B2 | 9/2013 | Yang et al. | |
| 2002/0192853 A1* | 12/2002 | Behammer | B81C 1/00484 438/52 |
| 2005/0269667 A1* | 12/2005 | Zonca | G11C 13/0069 257/530 |
| 2005/0269967 A1* | 12/2005 | Park | H01L 27/3253 315/222 |
| 2008/0157383 A1* | 7/2008 | Lim | H01L 29/42324 257/763 |
| 2013/0334483 A1* | 12/2013 | Ramaswamy | H01L 45/08 257/2 |

FOREIGN PATENT DOCUMENTS

| | | |
|---|---|---|
| JP | 4454675 B2 | 4/2010 |
| JP | 2010199449 A | 9/2010 |
| TW | I268550 B | 12/2006 |

* cited by examiner

*Primary Examiner* — Abul Kalam
(74) *Attorney, Agent, or Firm* — Anthony Canale; Hoffman Warnick LLC

(57) ABSTRACT

A method for forming a precision resistor or an e-fuse structure where tungsten silicon is used. The tungsten silicon layer is modified by implanting nitrogen into the structure.

13 Claims, 4 Drawing Sheets

MODIFIED TUNGSTEN SILICON

BACKGROUND

The present invention relates to semiconductor devices, and particularly to forming e-fuse and precision resistor structures.

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and efuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a stripe (commonly also called a "link") of conducting material (metal, poly-silicon, etc.) between two pads, generally referred to as anode and cathode. Applying a fuse current ($I_{FusE}$) to the E-fuse destroys the link, thus changing the resistance of the E-fuse. This is commonly referred to as "programming" the E-fuse. The fuse state (i.e., whether it has been programmed) can be read using a sense circuit, which is common in the art of electronic memories.

BRIEF SUMMARY

An embodiment of the invention may include a method of forming a semiconductor structure. The method may include forming a tungsten silicon layer on an Mx layer. Nitrogen may be introduced into the tungsten silicon layer to form a nitrogen-containing tungsten silicon layer. A first conductive material and a second conductive material on the nitrogen-containing tungsten silicon layer may be formed. The first conductive material and the second conductive material may be electrically insulated from each other, except for the nitrogen-containing tungsten silicon layer that forms an electrical connection between the first conductive material and the second conductive material.

The method may include forming a tungsten silicon layer on an Mx layer. Nitrogen may be introduced into the tungsten silicon layer to form a nitrogen-containing tungsten silicon layer. The tungsten silicon layer may have a ratio of silicon to tungsten of about 2.7. A first conductive material and a second conductive material on the nitrogen-containing tungsten silicon layer may be formed. The first conductive material and the second conductive material may be electrically insulated from each other, except for the nitrogen-containing tungsten silicon layer that forms an electrical connection between the first conductive material and the second conductive material.

Another embodiment of the invention may include a semiconductor structure. The semiconductor structure may include an Mx layer and a nitrogen-containing tungsten silicon layer on the Mx layer. There may be a first conductive material contacting a first region of the nitrogen-containing tungsten silicon layer and a second conductive material contacting a second region of the nitrogen-containing tungsten silicon layer. The nitrogen-containing tungsten silicon layer may form an electrical connection between the first conductive material and the second conductive material.

BRIEF DESCRIPTION OF THE SEVERAL DRAWINGS

Figure 1:
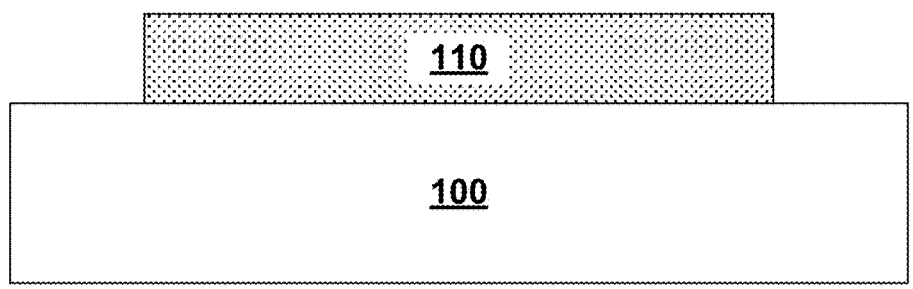
FIG. 1 is a cross-sectional view of a semiconductor structure containing a tungsten silicon layer deposited on a substrate, according to an embodiment of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Tungsten silicon may be an effective material in creating precision resistors or eFuse structures for semiconductor chips. This alloy is particularly useful for electromigration programming as result of the presence of two elements that can redistribute to anode and cathode during high density current pulses used for fusing the memory element. In some instances, deposition of a tungsten silicon layer 110 may create a layer having a formula of $WSi_x$. In order to create more efficient chips, resistance and $T_{CR}$ (Temperature Coefficient of Resistance) may be lowered by introducing nitrogen into the tungsten silicon after deposition. Uniform modification of the composition of the material can be exploited to control transport properties such as electrical resistance and TCR.

Referring to FIG. 1, a tungsten silicon layer 110, for use in semiconductor devices, may be created by depositing tungsten silicon on a $M_x$ layer 100. The resulting tungsten silicon layer 110 may have a chemical formula of $WSi_x$, where the ratio of silicon located in the crystal lattice of the structure is 2.2 to 3.0 that of tungsten, more preferably 2.6 to 2.8 that of tungsten, even more preferably 2.7 that of tungsten. The deposition of the tungsten silicon layer 110 may be performed using any suitable method in the art such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition, the thickness of the tungsten layer may be 10 to 20 nm. The tungsten silicon layer 110 may be deposited on $M_x$ layer 100, wherein the $M_x$ layer 100 may be any suitable material, such as, for example, conductors, insulators, or combinations thereof. In an example embodiment, the $M_x$ layer 100 may be an insulator such as, for example, metal oxides, metal nitrides or metal oxynitrides. In other embodiments, the Mx layer 100 may have a combination of insulator layers and conductive layers. In such embodiments, the conductive metal may be, for example, copper, aluminum, tungsten or combinations thereof.

Figure 2:
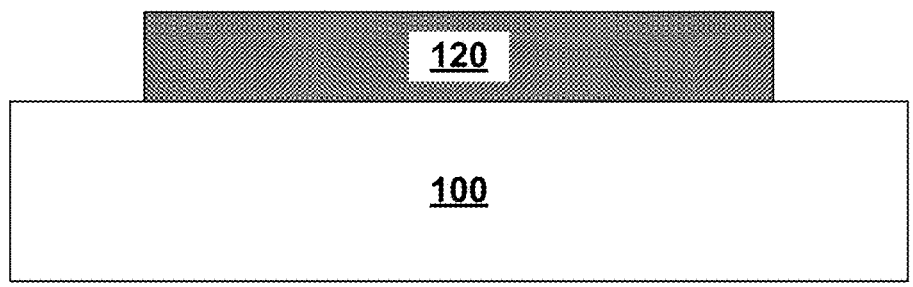
FIG. 2 is a cross-sectional view the semiconductor structure following introduction of nitrogen into the tungsten silicon layer, according to an embodiment of the invention.

Referring to FIG. 2, following the deposition of the tungsten silicon layer 110, plasma nitridation may be performed in order to implant nitrogen into the tungsten silicon layer 110, forming a nitrogen-containing tungsten silicon layer 120. This may change the chemical composition of the tungsten silicon layer 110, which may decrease the resistance and TCR of the resulting material. The resulting nitrogen-containing tungsten silicon layer 120 that is formed by this step of the present invention may be comprised of a nitride, oxynitride or combinations and multilayers thereof depending on the type of nitrogen ambient used in forming nitrogen-containing tungsten silicon layer 120. Following the introduction of nitrogen, the concentration of nitrogen in the nitrogen-containing tungsten silicon layer 120 may be substantially uniform throughout the layer and may be about 1 to about 40 mole % nitrogen, more preferably about 10 to about 30 mole % nitrogen.

As stated above, nitrogen-containing tungsten silicon layer 120 is formed in the present invention by utilizing a low-temperature nitridation process. Note that the term "nitridation" as used herein denotes nitridation, oxynitridation or any combination thereof. The term "low-temperature", on the other hand, denotes a nitridation process that is carried out at a temperature of about 200° C. or less, with a temperature of from about 25° C. to about 150° C. being more highly preferred. At such temperatures, the nitridation process of the present invention is a plasma-based process. It is noted that a low-temperature nitridation process is employed herein to reduce the impact of temperature on underlying structures, however other nitridation process may be employed to create the nitrogen-containing tungsten silicon layer 120.

The nitridation process of the present invention is carried out in a nitrogen-containing ambient such as NO, $N_2$, $N_2O$, $NH_3$ or any combination thereof. In some embodiments, the nitridation process may be mixed with an inert gas such as He, Ar, Ne, Xe, Kr and mixtures thereof. When an admixture of nitrogen-containing ambient and inert gas is employed, the admixture may comprise from about 1 to about 100 weight % nitrogen-containing ambient, and from about 0 to about 99 weight % inert gas. More preferably, and in embodiments wherein a mixture of a nitrogen-containing ambient and inert gas is employed, the admixture comprises from about 5 to about 100 weight % nitrogen-containing ambient, and from about 0 to about 95 weight % inert gas. In a preferred embodiment of the present invention, $N_2$ is employed as the nitrogen-containing ambient.

Illustrative examples of different types of low-temperature nitridation processes that can be employed in the present invention, include, but are not limited to: decoupled plasma nitridation (DPN), slot plane antenna (SPA) nitridation and jet vapor nitridation (JVN).

A DPN technique is a low-temperature process in which nitrogen species are excited into a reactive state by decoupled RF plasma, and react with the surface layer. The SPA technique is also a nitrogen plasma based process, however the plasma source is based on a microwave unit that is focused by a conducting plate that contains several holes. JVN is a process by which nitrogen species activated by microwave plasma are supersonically ejected from a nozzle, causing a surface reaction.

In embodiments wherein DPN is used as the low-temperature nitridation technique, the following conditions are typically employed: pressure from about 1 mT to about 1 T, RF power of from about 100 W to about 1500 W, process time from about 5 to about 500 sec, bias of from about 0 to about 50 W are typically used, with pressure from about 5 to about 200 mT, RF power of from about 300 to about 1000 W, process time from about 5 to about 200 sec being more desirable.

In other embodiments wherein SPA is employed as the low-temperature nitridation process, the following conditions can be employed: pressure from about 1 mT to about 1 T, microwave power of from about 100 W to about 3000 W, process time from about 5 to about 500 sec are typically used, with pressure from about 5 to about 200 mT, RF power of from about 500 to about 2000 W, process time from about 5 to about 200 sec being more desirable.

In yet other embodiments wherein JVN is used as the low-temperature nitridation technique, the following conditions can be employed: microwave power of from about 50 to about 300 W, pressure from about 0.5 to about 5 T, jet velocities of from about 1 to about 10E4 cm/sec, with microwave power of from about 100 to about 200, pressure from about 1 to about 2 T, and jet velocities of about 3-5E4 cm/sec being more desirable.

It is noted that the above conditions given for the DPN, SPA and JVN techniques are exemplary and by no ways limit the scope of the present invention. Instead, other conditions which operate at the aforementioned low-temperature regime, and which do not adversely affect the patterned photoresist and/or damage the Si-containing Mx layer 100 can be used in the DPN, SPA or JVN techniques mentioned above.

Figure 3:
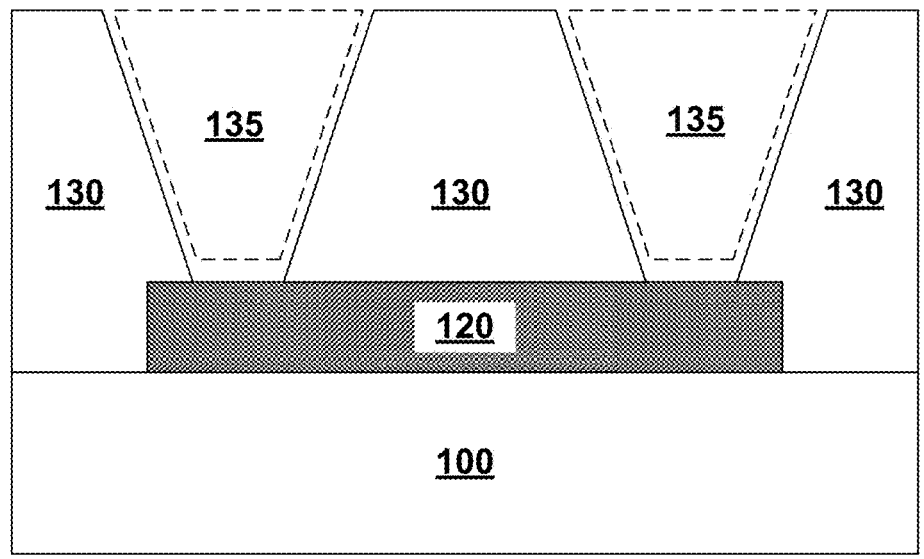
FIG. 3 is a cross-sectional view of the semiconductor structure following deposition of an insulator and creation of damascene voids, according to an embodiment of the invention.

With reference to FIG. 3, a $M_{x+1}$ dielectric 130 may be deposited over the structure, and subsequent damascene or dual damascene structures may be created. The $M_{x+1}$ dielectric 130 may electrically insulate the nitrogen-containing tungsten silicon layer 120 from additional interconnect levels (not shown) that may be subsequently formed above the nitrogen-containing tungsten silicon layer 120. The $M_{x+1}$ dielectric 130 may be deposited using typical deposition techniques, for example, chemical vapor deposition. The $M_{x+1}$ dielectric 130 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+1}$ dielectric 130 may have a thickness ranging from about 20 nm to about 60 nm and ranges there between, although a thickness less than 20 nm and greater than 60 nm may be acceptable.

Still referring to FIG. 3, a damascene opening 135 may be formed in the $M_{x+1}$ dielectric 130. The damascene opening 135 may include a trench opening and two via openings. The damascene opening 135 may be formed using any suitable masking and etching technique known in the art. In one embodiment, a dry etching technique using a fluorine based etchant, such as, for example $C_xF_y$, may be used. In one embodiment, the depth of the trench opening may range from about 50 nm to about 100 nm. Also, the via openings may extend vertically from the bottom of the trench opening down to the top of the first and second $M_x$ metals 206, 208.

Figure 4:
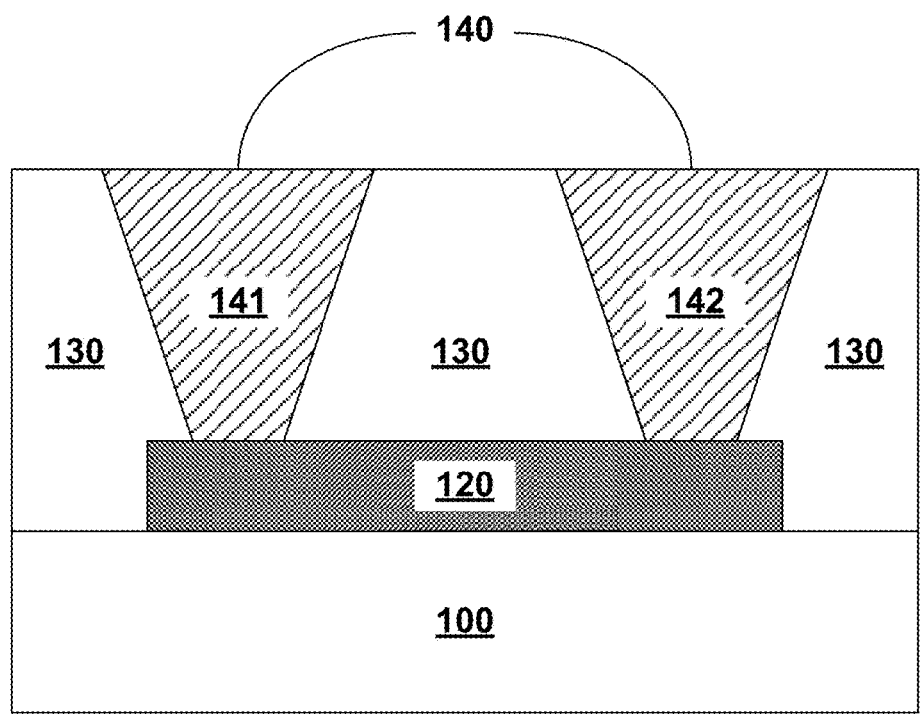
FIG. 4 is a cross-sectional view of the semiconductor structure following formation of conductive contacts in the damascene voids, according to an embodiment of the invention.

Referring now to FIG. 4, a set of conductive interconnects 140, containing a first conductive interconnect 141 and a second conductive interconnect 142, may be formed within the damascene opening 135. The set of conductive interconnects 140 may contain a liner and a metal fill may be deposited in via recess. The liner may be made of, for example, tantalum or tantalum nitride, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods. Following the creation of the set of conductive interconnects 140, the nitrogen-containing tungsten silicon layer 120 forms an electrical connection from the first conductive interconnect 141 to the second conductive interconnect 142, and may be used as an e-fuse or precision resistor as part of a semiconductor device.

Figure 5:
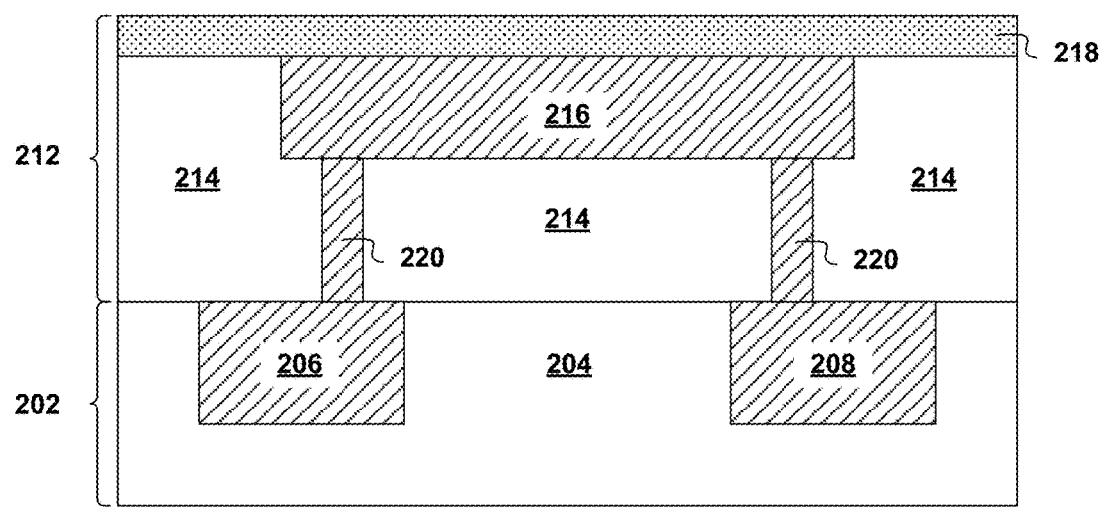
FIG. 5 is a cross-sectional view of an alternative semiconductor structure, according to an embodiment of the invention.

In additional embodiments an e-fuse structure depicted in FIG. 5 may be used. The e-fuse may include an $M_x$ level 202 and an $M_{x+1}$ level 212. The $M_x$ level 202 may include an $M_x$ dielectric 204 and two $M_x$ metals 206, 208. The $M_{x+1}$ level 212 may include an $M_{x+1}$ dielectric 214, a nitrogen-containing tungsten silicon layer 216, and two vias 220. In such embodiments, the nitrogen-containing tungsten silicon layer 216 may be the nitrogen-containing tungsten silicon layer formed using the process steps listed above. An $M_{x+1}$ cap dielectric 218 may be located above the $M_{x+1}$ dielectric 214 and electrically insulate the $M_{x+1}$ level 212 from additional interconnect levels (not shown) that may be subsequently formed above. The vias 220 may electrically connect the fuse line 216 to the $M_x$ metals 206, 208. The $M_x$ metals 206, 208, the vias 220, and the nitrogen-containing tungsten silicon layer 216 make up the e-fuse.

In either embodiment, a resultant structure is formed in which a nitrogen-containing tungsten silicon layer forms an electrical connection between two conductive regions. The two conductive regions may be vias, or lines, and may be made of a conductive material such as, for example, copper, tungsten or aluminum. The conductive regions may be electrically isolated from one another using a dielectric material, such that the only path for electric current to move from the first conductive region to the second conductive region is through the nitrogen-containing tungsten silicon layer.

In an example embodiment, a 16 nm thick tungsten silicon layer was deposited on Silicon oxide or silicon nitride underlying film to avoid insulation towards the regions of the chip built in prior steps. Nitrogen was then introduced into the tungsten silicon layer, forming the nitrogen-containing tungsten silicon layer, via DPN. The implantation power (wattage) of DPN was varied (0 W, 500 W, 100 W, and 1500 W) to determine the effects of the nitrogen irradiation. A 400° C. anneal was performed to approximate subsequent steps that may occur during semiconductor manufacture. The resistance and $T_{CR}$ of the resulting nitrogen-containing tungsten silicon layer were then measured. The addition of nitrogen may impede the formation of native oxide layers associated to silicon and tungsten.

Figure 6:
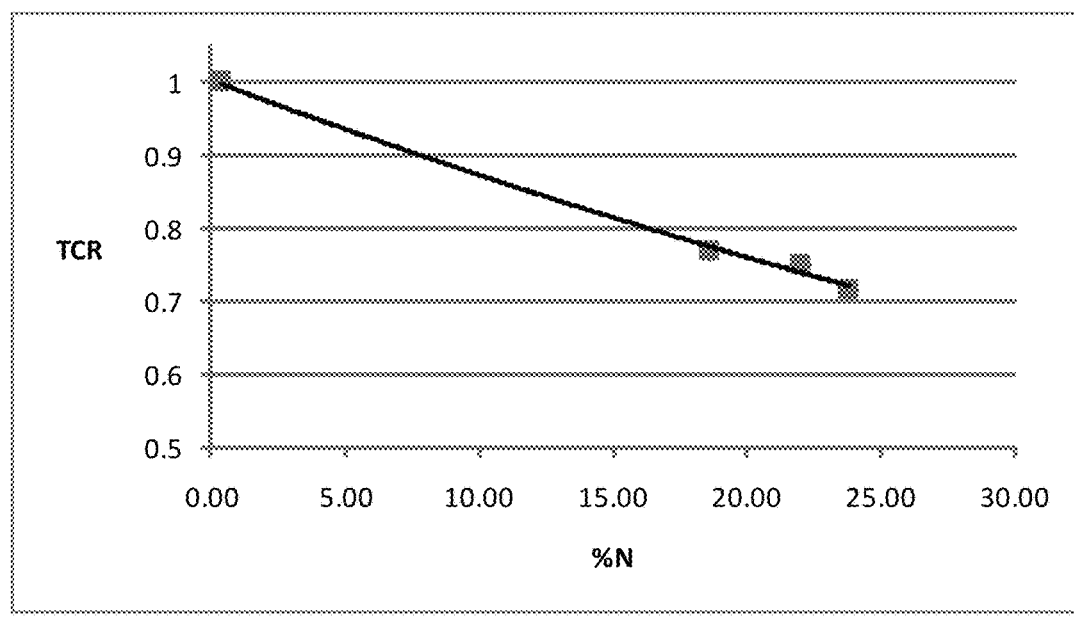
FIG. 6 is a graph showing the relationship between the concentration of nitrogen in the tungsten silicon layer and the temperature coefficient of resistance.
Figure 7:
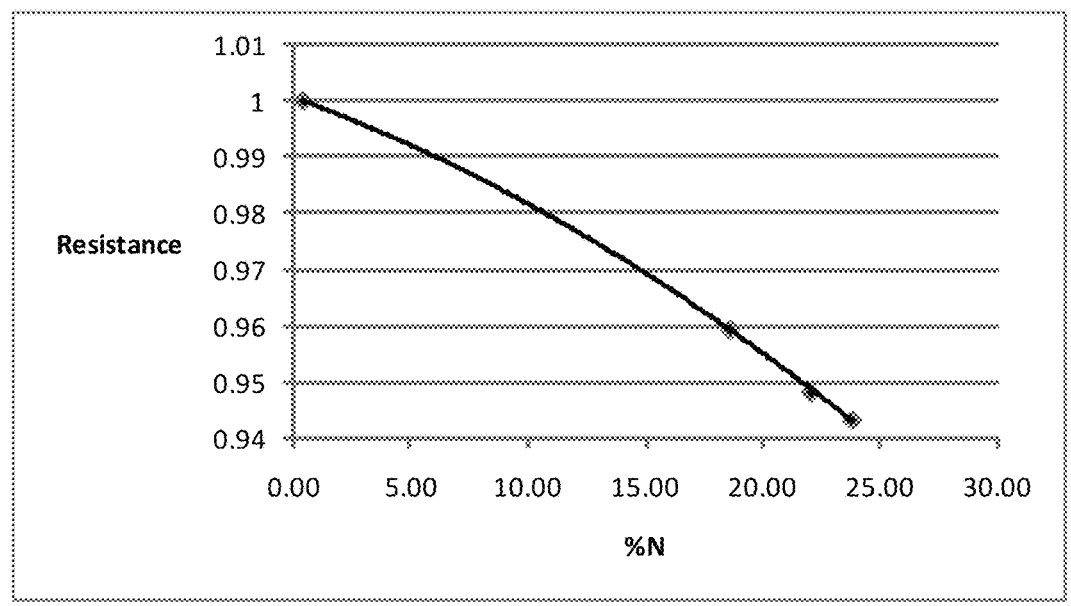
FIG. 7 is a graph showing the relationship between the concentration of nitrogen in the tungsten silicon layer and resistance.

FIG. 6 and FIG. 7 are graphs depicting the effects of nitrogen concentration, in mole % nitrogen, on $T_{CR}$ and resistance, respectively. FIG. 6 shows the effects of increasing the nitrogen concentration on the $T_{CR}$ (ppm/° C.) of the resulting conductive tungsten silicon layer. FIG. 7 shows the effects of increasing the nitrogen concentration on the resistance (Ω/square) of the resulting conductive tungsten silicon layer. To illustrate the effectiveness of the introduction of nitrogen, in the example embodiment when nitrogen introduced using 500 W DPN implantation intensity (corresponding to 18 mole % nitrogen concentration), a reduction of about 4% of the resistance and about 23% of the $T_{CR}$ was observed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    forming a tungsten silicon layer on the top surface of an insulator, wherein the tungsten silicon layer consists of tungsten and silicon with a molar ratio of silicon to tungsten in the range of about 2.2 to about 3.0;

introducing nitrogen into the tungsten silicon layer to form a nitrogen-containing tungsten silicon layer, wherein a concentration of nitrogen in the nitrogen-containing tungsten silicon layer is 1 mole % to about 40 mole %; and forming a first conductive material directly on the top surface of the nitrogen-containing tungsten silicon layer and a second conductive material directly on the top surface of the nitrogen-containing tungsten silicon layer, wherein the nitrogen-containing tungsten silicon layer forms an electrical connection between the first conductive material and the second conductive material, and wherein the forming of the first and second conductive materials comprises filling a first opening and a second opening of a dielectric layer formed on the nitrogen-containing tungsten silicon layer with the first conductive material and the second conductive material respectively.

2. The method of claim 1, wherein a molar ratio of silicon to tungsten in the tungsten silicon layer is in the range of about 2.6 to about 2.8.

3. The method of claim 1, wherein the concentration of nitrogen in the nitrogen-containing tungsten silicon layer is about 10 to about 30 mole %.

4. The method of claim 1, wherein introducing nitrogen into the tungsten silicon layer comprises performing a low temperature nitridation process on the tungsten silicon layer.

5. The method of claim 4, wherein the low temperature nitridation process comprises a decoupled plasma nitridation process, a slot plane antenna nitridation process or a jet vapor nitridation process.

6. The method of claim 5, wherein the low temperature nitridation process is the decoupled plasma nitridation process and has an implantation power of at least 500 W.

7. The method of claim 1, wherein introducing nitrogen comprises causing a reduction in a resistance of the tungsten silicon layer.

8. The method of claim 1, wherein introducing nitrogen comprises causing a reduction in a temperature coefficient of resistance of the tungsten silicon material layer.

9. A method of forming a semiconductor structure, the method comprising:

forming a tungsten silicon layer on the top surface of an insulator, wherein the tungsten silicon layer has a chemical formula $WSi_x$, where x is from 2.2 to 3.0; and implanting nitrogen into the tungsten silicon layer to form a nitrogen-containing tungsten silicon layer, wherein implanting nitrogen into the tungsten silicon layer comprises performing decoupled plasma nitridation having an implantation power of at least 500 W on the tungsten silicon layer.

10. The method of claim 9, wherein a concentration of nitrogen contained in the nitrogen-containing tungsten silicon layer is about 1 to about 40 mole %.

11. The method of claim 9, wherein a concentration of nitrogen contained in the nitrogen-containing tungsten silicon layer is about 10 to about 30 mole %.

12. The method of claim 9, wherein implanting nitrogen comprises causing a reduction in a resistance of the tungsten silicon layer.

13. The method of claim 9, wherein implanting nitrogen comprises causing a reduction in a temperature coefficient of resistance of the tungsten silicon material layer.

* * * * *